US010169928B2

(12) United States Patent
Chen et al.

(10) Patent No.: US 10,169,928 B2
(45) Date of Patent: Jan. 1, 2019

(54) APPARATUS FOR PROVIDING DATA TO A HARDWARE-IN-THE-LOOP SIMULATOR

(71) Applicant: Hitachi, Ltd, Tokyo (JP)

(72) Inventors: Heming Chen, Novi, MI (US); Sujit Phatak, Farmington Hills, MI (US); Yuan Xiao, Farmington Hills, MI (US)

(73) Assignee: Hitachi, Ltd., Tokyo (JP)

( * ) Notice: Subject to any disclaimer, the term of this patent is extended or adjusted under 35 U.S.C. 154(b) by 278 days.

(21) Appl. No.: 14/963,422

(22) Filed: Dec. 9, 2015

(65) Prior Publication Data
US 2017/0169623 A1 Jun. 15, 2017

(51) Int. Cl.
*G07C 5/00* (2006.01)
*G06F 17/50* (2006.01)
*G07C 5/02* (2006.01)
*G07C 5/08* (2006.01)

(52) U.S. Cl.
CPC ......... *G07C 5/008* (2013.01); *G06F 17/5009* (2013.01); *G07C 5/02* (2013.01); *G07C 5/0808* (2013.01)

(58) Field of Classification Search
CPC .. G05D 1/0033; G05D 1/0027; G05D 1/0234; F41G 7/303; G01M 17/007; G01M 17/04; G05B 15/02; G05B 19/0423
USPC ........................................................ 701/31.4
See application file for complete search history.

(56) References Cited

U.S. PATENT DOCUMENTS

| | | | | |
|---|---|---|---|---|
| 7,643,893 | B2* | 1/2010 | Troy | G05D 1/0033 700/65 |
| 9,423,822 | B1* | 8/2016 | Singh | G06F 1/12 |
| 2006/0074970 | A1* | 4/2006 | Narayanan | G06F 11/3419 |
| 2007/0260373 | A1* | 11/2007 | Langer | G01M 17/007 701/31.4 |
| 2008/0033684 | A1* | 2/2008 | Vian | F41G 7/303 702/113 |
| 2015/0277406 | A1* | 10/2015 | Maturana | G05B 19/0423 700/83 |

* cited by examiner

*Primary Examiner* — Redhwan K Mawari
(74) *Attorney, Agent, or Firm* — Mattingly & Malur, PC

(57) ABSTRACT

Apparatus for providing real-time data to a hardware-in-the-loop simulator for an automotive vehicle. The apparatus includes a test vehicle having at least one sensor which generates an output signal representative of a condition of the vehicle. A wireless transmitter such as a cellular phone on the motor vehicle receives the sensor output signal as an input signal and transmits that output signal to a computer network. A simulator data server receives the data from the computer network and provides that data to the hardware-in-the-loop simulator.

16 Claims, 4 Drawing Sheets

APPARATUS FOR PROVIDING DATA TO A HARDWARE-IN-THE-LOOP SIMULATOR

BACKGROUND OF THE INVENTION

I. Field of the Invention

The present invention relates generally to an apparatus, method, and system for providing real-time data to a hardware-in-the-loop simulator for an automotive vehicle system.

II. Description of Relevant Art

In the automotive industry, an automotive vehicle is a complex system consisting of a variety of mechanical, electrical, and embedded systems. A typical gasoline engine powered automobile, for example, may contain as many as 70 control systems which range from door lock to complex systems such as an engine controller, transmission controller, stability controller, and the like. Furthermore, as autonomous driving capability is gaining widespread attention, more sensors and embedded systems are being integrated into the automotive vehicles which further increases the complexity of those future vehicles.

During the development of an automotive system, a hardware-in-the-loop (HIL) simulation is often used to test complex automotive systems. In an HIL simulation, the test subject, such as the electrical control unit (ECU) for the engine, may be tested using a virtual vehicle for validation, testing, and verification of the ECU.

In view of the complexity of many automotive systems, in-vehicle tests for a particular automotive system are time consuming and expensive. However, previously HIL simulators allow developers to validate new automotive systems quickly enough to satisfy the time-to-market restrictions imposed on the automotive industry.

In a typical HIL simulator, a test plant is emulated using mathematical models which are executed in real time by programmed processors. An input/output interface allows the test subject, such as the ECU, to be connected to the vehicle sensors and actuators. Finally, the ECU under test is connected to the HIL simulator system and behaves as if it was installed in a real automotive vehicle.

Unfortunately, HIL simulators have not been able to keep up with the increasing complexity of automotive systems. This inability is due, in large part, to the outdated static design for the HIL simulators. For example, in existing HIL simulators, the HIL simulator is built as an isolated system with an ad hoc connection to the tested system. All test vehicles and input data must be prepared in advance and transferred to the HIL simulator before the simulation can begin. Due to such design, however, expanding test coverage is difficult since a huge amount of test data needs to be prepared prior to start of the test.

Furthermore, as autonomous driving becomes a reality, the autonomous driving controller needs to be developed and tested. However, a traditional HIL simulator cannot provide realistic test scenarios for such autonomous vehicles. Rather, comprehensive tests still rely upon in-vehicle tests which, as a practical matter, cannot occur until a very late stage of the development cycle. Furthermore, any design change proposed at this late development stage typically is very costly to install.

SUMMARY OF THE PRESENT INVENTION

The present invention provides an apparatus, method, and system which overcomes the above-mentioned disadvantages of the previously known HIL simulators by providing the HIL simulator with real-time data.

In brief, the apparatus, method, and system of the present invention includes a test vehicle having at least one sensor which generates an output signal representative of a condition of the vehicle. A wireless transmitter, such as a cellular telephone, is contained on the vehicle. The wireless transmitter receives the sensor output signal as an input signal and then transmits that output signal to a computer network, such as the World Wide Web.

A simulator data server receives the data from the computer network and provides that data to the hardware-in-the-loop simulator, preferably through a local area network. The use of the wireless transmission from the test vehicle through the World Wide Web and to the hardware-in-the-loop simulator creates a cloud-in-the-loop (CIL) simulator.

The CIL simulator of the present invention achieves two major advantages over the previously known hardware-in-the-loop simulators. First, the CIL simulator of the present invention is more realistic than the traditional HIL simulator since the CIL simulator employs a real-time wireless connection to a sensor vehicle. As such, the test vehicle provides real-time data back to the simulation data server. That data server then forwards the data to an automotive system under test through an HIL simulation interface.

Secondly, a second advantage of the CIL simulator is that it is more safe than the previously known systems tested using HIL simulators. More specifically, as automotive systems become sophisticated, testing them on the road becomes more difficult. Improper test setup can result in accidents or other failures. However, since the part under test is contained in a lab no accidents can occur in the real world.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
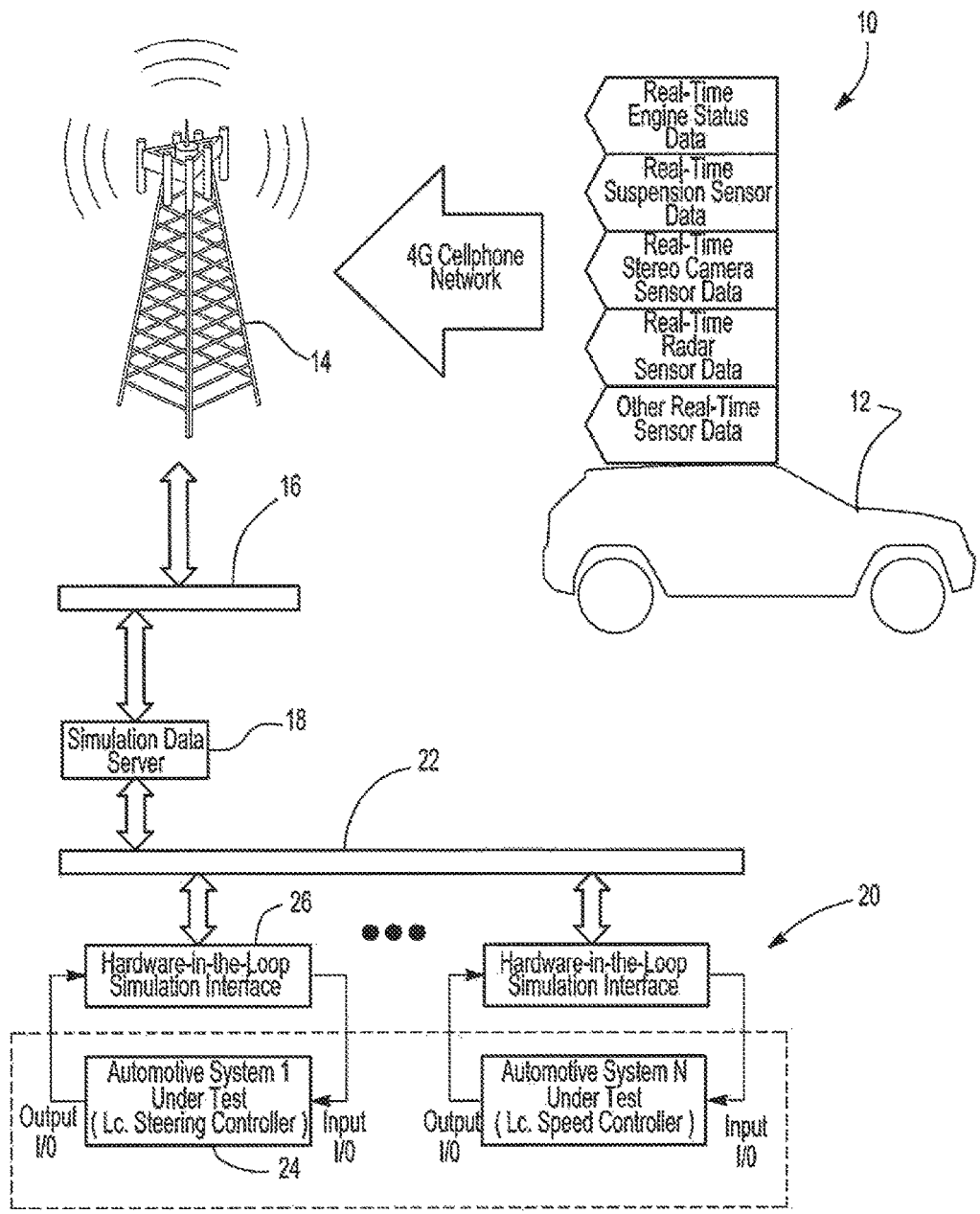
FIG. 1 is a block diagrammatic view of the cloud-in-the-loop simulator of the present invention.

With reference first to FIG. 1, a block view of the overall cloud-in-the-loop simulation system 10 of the present invention is shown. In a fashion that will be subsequently described in greater detail, the system includes a test vehicle 12 having a number of sensors. Each sensor is designed to sense a particular condition of the vehicle. The values from the sensor are then transmitted by cellular telephone to a cellular tower 14 which then couples the received data to a computer network 16, such as the World Wide Web. A simulation data server 18 then receives the data from the computer network 16 and then connects this processed data to a hardware-in-the-loop simulator 20 through a local area network 22.

The hardware-in-the-loop (HIL) simulator 20 includes both the circuit 24 under test as well as a HIL simulation interface 26 between the local area network 22 and the circuit 24 under test. Furthermore, as shown in FIG. 1, multiple different circuits 24 may be simultaneously connected to the local area network 22 and undergo testing simultaneously.

Figure 2:
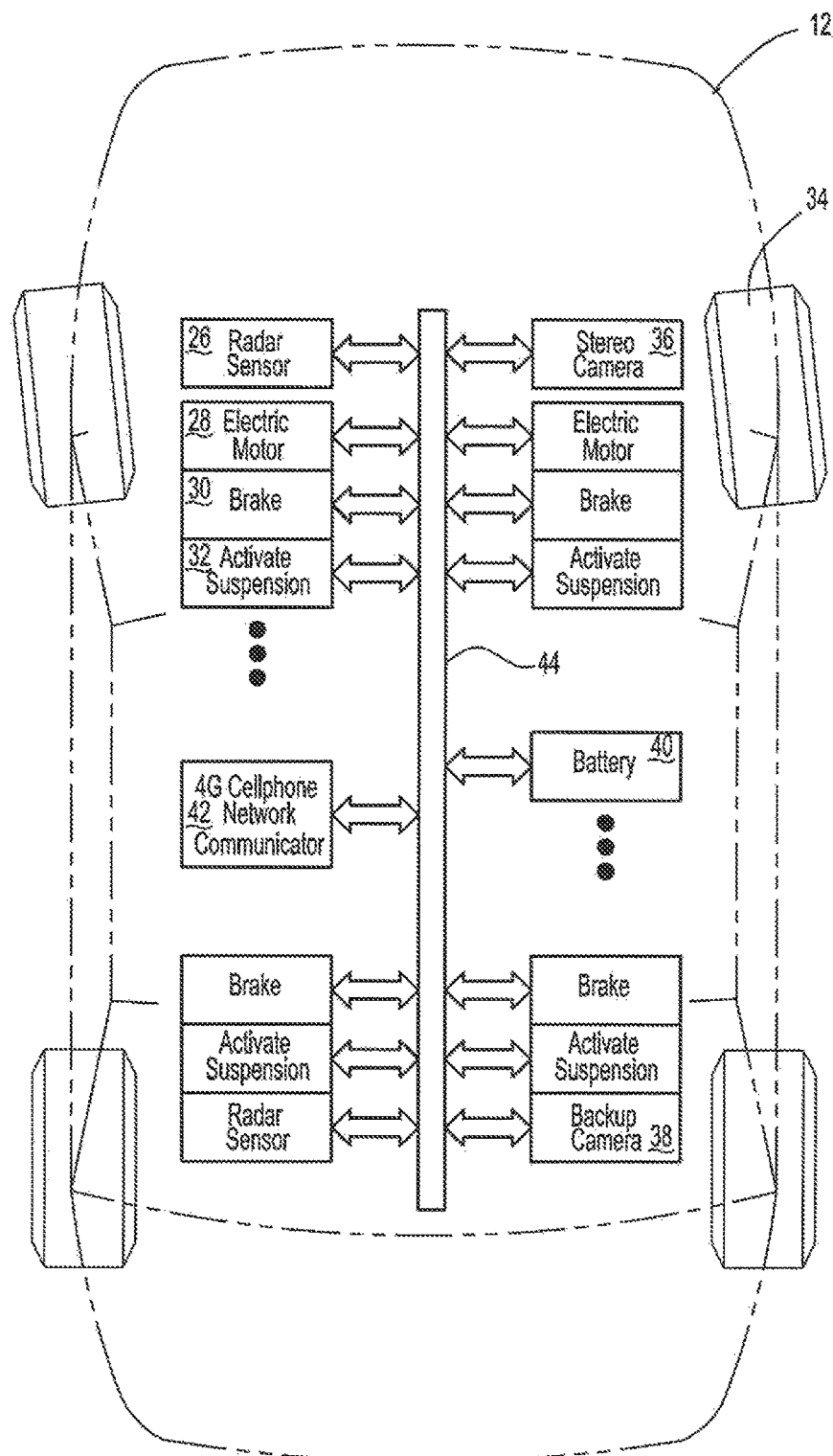
FIG. 2 is a diagrammatic illustration of an exemplary sensor vehicle.

With reference now to FIG. 2, a block diagram of the test vehicle 12 is there shown in greater detail. The test vehicle 12 includes a number of different sensors. The sensors include, for example, a radar sensor 26, an electric motor sensor 28 if the vehicle is an electric vehicle, a brake sensor 30, and a suspension sensor 32. Some sensors, for example the brake sensor 30, are associated with each wheel 34 of the vehicle 12. Other sensors, such as a stereo camera sensor 36, backup camera 38, and battery sensor 40, are singular so that only one sensor is provided for the entire vehicle 12.

A cellular telephone network communicator 42 is also contained on the vehicle 12. The network communicator 42, furthermore, communicates with all of the sensors on the vehicle 12 through a network 44, such as a CAN network. Other networks, of course, may alternatively be used.

It will be understood, of course, that the sensors shown in FIG. 2 are by way of example only. In a real vehicle, different and/or additional sensors may be included with the vehicle 12.

Figures 5, 6:
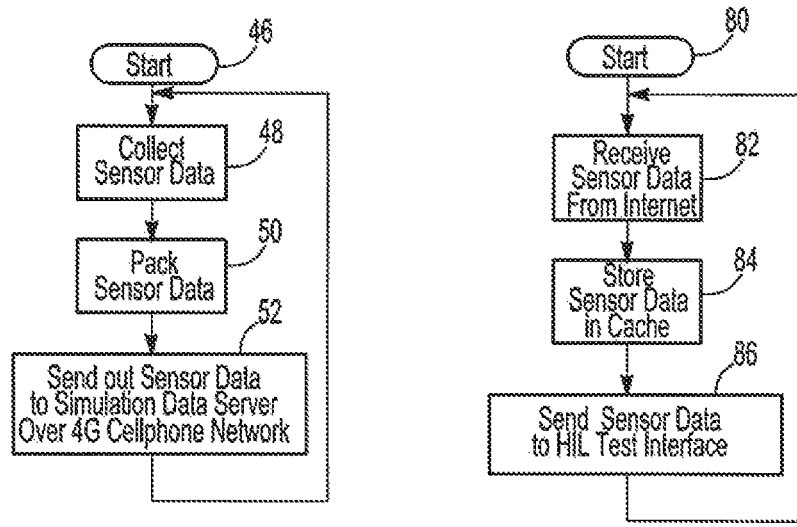
FIG. 5 is a flowchart of the processor in the sensor vehicle.
FIG. 6 is a flowchart illustrating the operation of the simulation data server.

With reference now to FIGS. 2 and 5, the network communicator 42 includes a programmed processor that processes the data received from the sensors via the bus 44 prior to transmitting the sensor data over the cellular network. FIG. 5 illustrates one method of processing the data.

In particular, as in FIG. 5, after start of the processor program at step 46, step 46 proceeds to step 48 where the network communicator processor collects the sensor data from the various sensors 26-40 during a predetermined time slot, e.g. 1/100 of a second. Step 48 then proceeds to step 50.

At step 50, the processor packs the sensor data from the various vehicle sensors into data packets with one packet representing the data from a single sensor. Although any conventional type of data packing may be employed, conventionally the data packet includes a start byte and ending byte for the data packet. An identification byte or bytes follow the start byte to identify the sensor and optionally the number of data bytes associated with that sensor. After the identification byte, the data bytes contain the actual data from the sensor followed by the end byte. Consequently, since each data packet contains not only the identification of the sensor, but also the data from that sensor, the subsequent decomposition of the data packet to identify the sensor and its value is straightforward. After the sensor data is packed at step 50, step 50 proceeds to step 52.

At step 52 the network communicator 42 wirelessly transmits the data over a cellular telephone network, such as a 4G data network. That wireless cellular telephone transmission is received by the cellular tower 14 (FIG. 1) and conveyed to the World Wide Web 16.

The above-described collection of data from the sensors, packing of the sensor data, and transmission of the sensor data over the cellular telephone network occurs continually in sequential timeslots. Furthermore, since the network communicator with its wireless transmitter is contained on the vehicle 12, the transmission of the sensor data by the network communicator 42 occurs on a real-time basis from the vehicle 12.

Figure 3:
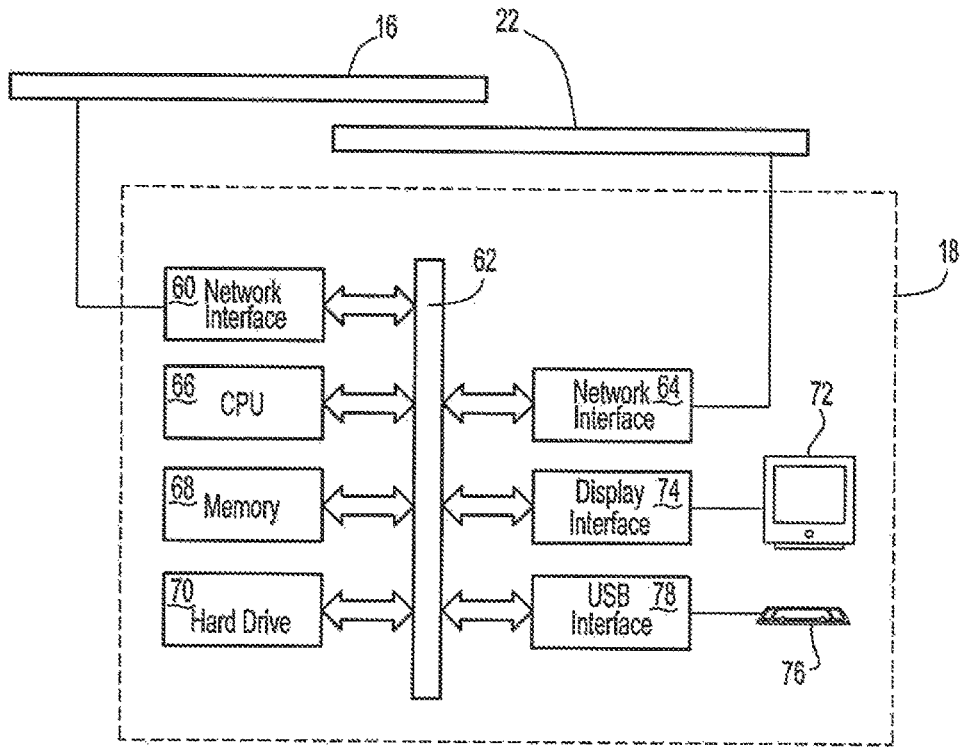
FIG. 3 is a diagrammatic view of the simulation data server.

With reference now to FIG. 3, a block diagrammatic view of the simulation data server 18 is shown. The simulation data server 18 receives the input from the World Wide Web 16, processes that data, and then provides that data to the local area network 22 (FIG. 1).

The simulation data server 18 includes a first network interface 60 which communicates between a bus 62 and the World Wide Web 16, and a second network interface 64 which communicates between the bus 62 and the local area network 22. The simulation data server 18 also includes a programmed processor 66, computer memory 68, and persistent memory 70 such as a hard drive, flash drive, or the like. All of the communication between the CPU 66, its memory 68, and persistent memory 70 occurs through the bus 62.

Optionally, a monitor 72 communicates with the bus 62 through a display interface 74. Likewise, a keyboard 76 optionally communicates with the bus 62 through a keyboard interface 78, such as a USB interface. The monitor 72 allows the data to be observed while the keyboard 76 allows the data to be varied if desired by the operator.

With reference now to FIG. 6, the operation of the simulation data server 18 is shown. After initiation of the simulation data server 18 at step 80, step 80 proceeds to step 82 where the CPU 66 controls the network interface 60 under program control to receive the sensor data from the World Wide Web 16. This data, furthermore, may be received in single packets or groups of packets which are processed simultaneously. Step 82 then proceeds to step 84.

After the data packets are received from the Internet at step 82, the CPU 66 stores the sensor data in a cache at step 84. The storage of data in the cache at step 84 creates a buffer that simulation test can use in a case that a data interruption occurs in the World Wide Web connection. In that case, the data that was already received by the simulation data server 18 and stored in the cache at step 84 may be processed. Step 84 then proceeds to step 86 where the processor 66 sends the sensor data to the local area network 22.

Figure 4:
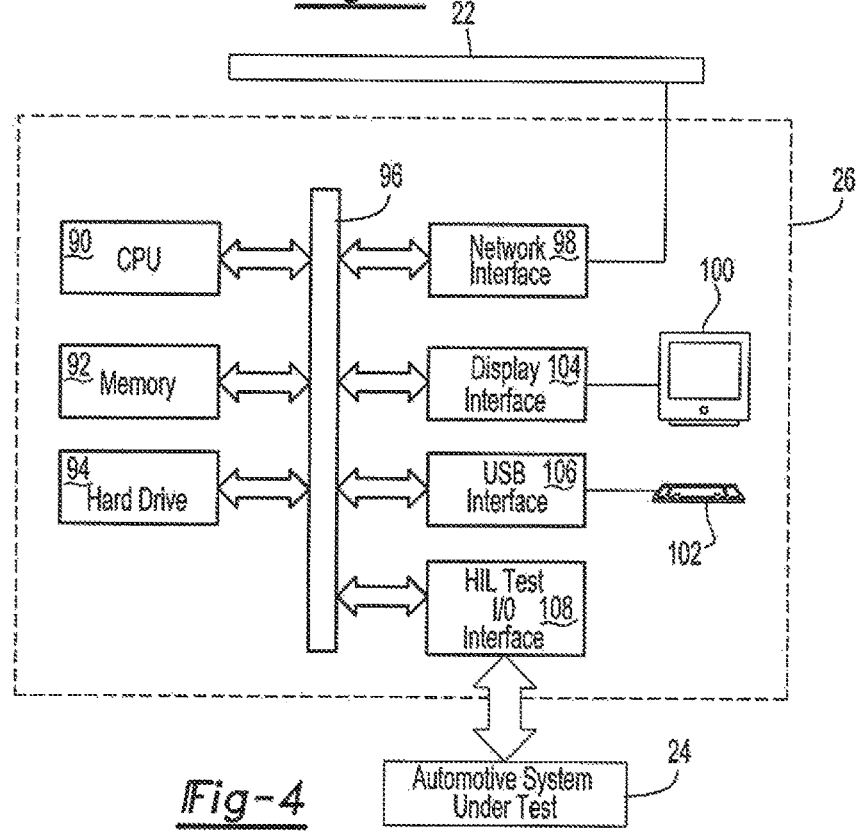
FIG. 4 is a block diagrammatic view of the hardware-in-the-loop simulation interface.

With reference now to FIG. 4, one hardware-in-the-loop (HIL) simulation interface 26 is provided for each automotive circuit 24 under test. The HIL simulation interface 26 includes a programmed processor 90 having both digital memory 92 and persistent memory 94 electrically connected to it through a bus 96. The bus 96 is also connected to the local area network 22 through a network interface 98. A monitor 100 and keyboard 102 are optionally connected to the bus 96 through a display interface 104 and keyboard interface 106 in the conventional fashion.

The HIL simulation interface 26 also includes an HIL test I/O interface 108 which interconnects the bus 96 with the circuit 24 under test. Consequently, the HIL test I/O interface 108 controls all of the input and output to the circuit 24 under test under control of the processor 90. The processor in turn receives sensor data from the local area network 22 through the network interface 98. The HIL test interface 108, furthermore, is custom designed for each different type of circuit 24 under test.

Figure 7:
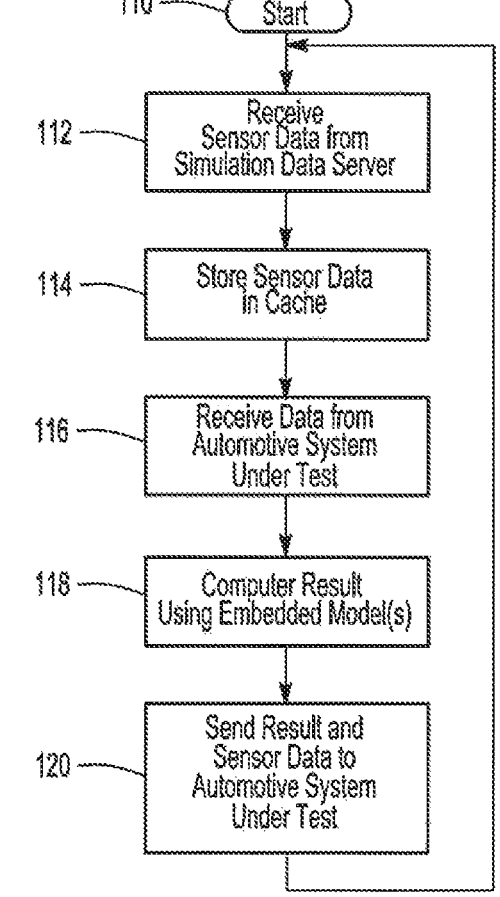
FIG. 7 is a flowchart illustrating the HIL simulation interface.

With reference now to FIG. 7, a flowchart illustrating the operation of the HIL simulation interface 26 is shown. The program first starts at step 110 which then proceeds to step 112. At step 112, the processor 90 controls the network interface 98 to receive sensor data from the simulation data server 18 through the local area network 22. This data may be received in single data packets with one packet from a single sensor, or in groups of data packets. Step 112 then proceeds to step 114.

At step 114 the processor 90 stores the data packets in a data cache. As before, the use of the data cache enables at least some data to be processed even in the event of an interruption of data from the local area network 22. Step 114 then proceeds to step 116. At step 116, the processor 90 receives data from the circuit 24 under test through the HIL test I/O interface 108. This data may be either input data from the circuit 24 under test or output data to the circuit 24 under test. In either event, the transfer of this data through the HIL test interface 108 is under control of the programmed processor 90. Step 116 then proceeds to step 118.

At step 118, the processor 90 executes a mathematical model of the plant under control by the circuit 24 stored in the computer memory using data received from the test vehicle 12 through the local area network 22 as well as data from the circuit 24 under test through the HIL test interface 108. Step 118 then proceeds to step 120.

At step 120 the HIL simulation interface 26 sends the computed results or dependent variables together with the newest sensor data stored in the local cache to the circuit 24 under test. In response to these new results, the circuit 24 under test will process those results and generate new outputs which are coupled back to the processor 90 via the HIL test interface 108 whereupon the entire process is repeated.

A primary advantage of the present invention is that it allows real-time data to be processed from the test vehicle 12 which may be located virtually anywhere the vehicle can be operated. For example, by using different test vehicles 12 in different climates, i.e. desert climates versus arctic climates, sequential tests may be performed on the circuit 24 under test contained within a single lab. Furthermore, since real-time data from the vehicle is processed by the circuit 24 under test, the operation of the vehicle 12 may be modified, as desired, thus eliminating the previously known requirement that data be preprocessed and fed into the simulator prior to the start of the simulation.

Secondly, since the entire simulation is conducted within the lab, the simulation is conducted without the possibility of prototype vehicles malfunctioning and creating an accident. This is particularly true for autonomous vehicles that are only in their initial stage of development.

Having described our invention, many modifications thereto will become apparent to those skilled in the art to which it pertains without deviation from the spirit of the invention as defined by the scope of the appended claims.

We claim:

1. An apparatus for providing real-time data for testing a circuit for an automotive vehicle system, the apparatus comprising:
    a test vehicle having at least one sensor which generates a sensor output signal representative of a condition of the vehicle;
    a wireless transmitter contained on the test vehicle which receives the sensor output signal and transmits the sensor output signal to a computer network as sensor data from the test vehicle;
    a simulator data server which receives, from the computer network, the sensor data from the test vehicle; and
    a hardware-in-the-loop simulator comprising at least one circuit under test and a hardware-in-the-loop interface associated with the circuit under test,
    the hardware-in-the-loop interface comprising a processor that receives, from the simulator data server, the sensor data from the test vehicle, the hardware-in-the-loop interface further comprising a test interface that enables the processor to communicate with the circuit under test,
    wherein the processor is programmed to execute a simulation model of the automotive vehicle system using the sensor data from the test vehicle and circuit data received from the circuit under test, and provide simulation results to the circuit under test via the test interface to enable the circuit under test to process the simulation results to provide new circuit data to the processor via the test interface.

2. The apparatus as defined in claim 1 wherein the computer network comprises the Internet.

3. The apparatus as defined in claim 1 wherein the wireless transmitter comprises a cellular transmitter.

4. The apparatus as defined in claim 2 wherein the simulator data server communicates to the hardware-in-the-loop simulator through a local area network.

5. The apparatus as defined in claim 1 wherein the simulator data server comprises a data cache that stores the sensor data from the test vehicle.

6. The apparatus as defined in claim 4 wherein the simulator data server comprises a first network interface which connects to the Internet and a second network interface which connects to the local area network.

7. The apparatus as defined in claim 6 wherein the simulator data server comprises a processor programmed to convert the sensor data from the test vehicle received from the Internet into an input format used by the hardware-in-the-loop simulator.

8. The apparatus as defined in claim 1 wherein the hardware-in-the-loop simulator comprises a plurality of the electronic circuits under test and a respective hardware-in-the-loop interface associated with each electronic circuit under test the respective hardware-in-the-loop interface providing communication between the local area network and a respective electronic circuit under test to receive the sensor data from the test vehicle corresponding to the respective electronic circuit under test.

9. A method for providing real-time data for testing a circuit for an automotive vehicle system, the method comprising:
    placing at least one sensor on a test vehicle which generates a sensor output signal representative of a condition of the vehicle;
    wirelessly transmitting the sensor output signal by a wireless transmitter to a computer network as sensor data from the test vehicle;
    receiving, by a server, from the computer network, the sensor data from the test vehicle;
    providing the sensor data from the test vehicle to a processor of a hardware-in-the-loop interface of a hardware-in-the-loop simulator;
    executing, by the processor, a simulation model of the automotive vehicle system using the sensor data from the test vehicle and circuit data received from the circuit under test;
    sending, by the processor, simulation results to the circuit under test via a test interface of the hardware-in-the-loop interface; and
    processing, by the circuit under test, the simulation results to provide new circuit data to the processor via the test interface.

10. The method as defined in claim 9 wherein the computer network comprises the Internet.

11. The method as defined in claim 9 wherein the wireless transmitter comprises a cellular transmitter.

12. The method as defined in claim 10 wherein the server communicates to the hardware-in-the-loop simulator through a local area network.

13. The method as defined in claim 12 wherein the server comprises a data cache that stores the sensor data from the test vehicle.

14. The method as defined in claim 12 wherein the server comprises a first network interface which connects to the Internet and a second network interface which connects to the local area network.

15. The method as defined in claim 14 wherein the server comprises a processor programmed to convert the sensor data from the test vehicle received from the Internet into an input format used by the hardware-in-the-loop simulator.

16. The method as defined in claim 12 wherein the hardware-in-the-loop simulator comprises a plurality of the electronic circuits under test and a respective hardware-in-the-loop interface associated with each electronic circuit under test, each hardware-in-the-loop interface providing communication between the local area network and a respective electronic circuit under test to receive the sensor data from the test vehicle corresponding to the respective electronic circuit under test.

* * * * *